US010284150B2

(12) United States Patent
Watanabe et al.

(10) Patent No.: US 10,284,150 B2
(45) Date of Patent: *May 7, 2019

(54) POWER AMPLIFICATION MODULE (71) Applicant: Murata Manufacturing Co., Ltd., Kyoto (JP)

(72) Inventors: Kazuo Watanabe, Kyoto (JP); Satoshi Tanaka, Kyoto (JP); Kazuhito Nakai, Kyoto (JP); Takayuki Tsutsui, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/717,161

(22) Filed: Sep. 27, 2017

(65) Prior Publication Data

US 2018/0019713 A1 Jan. 18, 2018

Related U.S. Application Data

(63) Continuation of application No. 15/274,313, filed on Sep. 23, 2016, now Pat. No. 9,825,594.

(30) Foreign Application Priority Data

Nov. 27, 2015 (JP) ................... 2015-232136

(51) Int. Cl.
*H03F 3/04* (2006.01)
*H03F 1/32* (2006.01)
(Continued)

(52) U.S. Cl.
CPC ............. *H03F 1/3205* (2013.01); *H03F 1/02* (2013.01); *H03F 1/0261* (2013.01); *H03F 1/302* (2013.01);
(Continued)

(58) Field of Classification Search
CPC .......... H03F 1/3205; H03F 3/19; H03F 3/245; H03F 3/211
(Continued)

(56) References Cited

U.S. PATENT DOCUMENTS 5,889,434 A 3/1999 Shimura
9,825,594 B2* 11/2017 Watanabe ............. H03F 1/0261
2015/0295549 A1 10/2015 Hirooka

FOREIGN PATENT DOCUMENTS

JP H10-135750 A 5/1998

* cited by examiner

*Primary Examiner* — Khanh V Nguyen
*Assistant Examiner* — Khiem D Nguyen
(74) *Attorney, Agent, or Firm* — Pearne & Gordon LLP (57) ABSTRACT

A power amplification module includes: a first transistor that amplifies a first radio frequency signal and outputs a second radio frequency signal; a second transistor that amplifies the second radio frequency signal and outputs a third radio frequency signal; and first and second bias circuits that supply first and second bias currents to bases of the first and second transistors. The first bias circuit includes a third transistor that outputs the first bias current from its emitter or source, a capacitor that is input with the first radio frequency signal and connected to the base of the first transistor, a first resistor connected between the emitter or source of the third transistor and the base of the first transistor, a second resistor connected between the capacitor and the emitter or source of the third transistor, and a third resistor connected between the capacitor and the base of the first transistor.

5 Claims, 10 Drawing Sheets

(51) Int. Cl.
*H03F 3/19* (2006.01)
*H03F 3/21* (2006.01)
*H04B 1/04* (2006.01)
*H03F 1/02* (2006.01)
*H03F 1/30* (2006.01)
*H03F 3/24* (2006.01)

(52) U.S. Cl.
CPC ............... *H03F 1/32* (2013.01); *H03F 3/19* (2013.01); *H03F 3/211* (2013.01); *H03F 3/24* (2013.01); *H03F 3/245* (2013.01); *H04B 1/0475* (2013.01); *H03F 2200/18* (2013.01); *H03F 2200/21* (2013.01); *H03F 2200/451* (2013.01); *H03F 2201/3215* (2013.01); *H03F 2203/21106* (2013.01); *H04B 2001/045* (2013.01)

(58) Field of Classification Search
USPC ................................ 330/285, 296, 302–606
See application file for complete search history.

POWER AMPLIFICATION MODULE

This application claims priority from U.S. patent application Ser. No. 15/274,313 filed on Sep. 23, 2016 which claims priority from Japanese Patent Application No. 2015-232136 filed on Nov. 27, 2015. The content of this application is incorporated herein by reference in its entirety.

BACKGROUND

The present disclosure relates to a power amplification module.

A power amplification module is used in a mobile communication device such as a cellular phone in order to amplify the power of a radio frequency (RF) signal to be transmitted to a base station. A bias circuit is used in a power amplification module. The bias circuit is for supplying a bias current to a power amplification transistor. For example, Japanese Unexamined Patent Application Publication No. 10-135750 discloses a power amplification module that includes a plurality of amplification stages in which transistors are used as amplification elements. The power amplification module disclosed in Japanese Unexamined Patent Application Publication No. 10-135750 is configured such that an initial stage bipolar transistor and a final stage bipolar transistor each have a common emitter, and the initial stage bipolar transistor is made to operate in a base current constant mode and the final stage bipolar transistor is made to operate in a base voltage constant mode.

However, in the power amplification module disclosed in Japanese Unexamined Patent Application Publication No. 10-135750, the gain falls as the output power increases and consequently the linearity of the power amplification module is degraded.

BRIEF SUMMARY

The present disclosure was made in light of such circumstances, and the present disclosure improves the linearity of a power amplification module.

A power amplification module according to an embodiment of the present disclosure includes: a first transistor that amplifies a first radio frequency signal and outputs a second radio frequency signal; a second transistor that amplifies the second radio frequency signal and outputs a third radio frequency signal; a first bias circuit that supplies a first bias current to a base of the first transistor; and a second bias circuit that supplies a second bias current to a base of the second transistor, where the first bias circuit includes a third transistor that outputs the first bias current from an emitter or a source thereof, a capacitor that has the first radio frequency signal input to one end thereof and has another end thereof connected to the base of the first transistor, a first resistor that has one end thereof connected to the emitter or source of the third transistor and has another end thereof connected to the base of the first transistor, a second resistor that has one end thereof connected to the one end of the capacitor and has another end thereof connected to the emitter or source of the third transistor, and a third resistor that has one end thereof connected to the one end of the capacitor and has another end thereof connected to the base of the first transistor.

According to the embodiment of the present disclosure, the linearity of a power amplification module can be improved.

Other features, elements, characteristics and advantages of the present disclosure will become more apparent from the following detailed description of embodiments of the present disclosure with reference to the attached drawings.

DETAILED DESCRIPTION

1. Configuration of Transmission Unit

Figure 1:
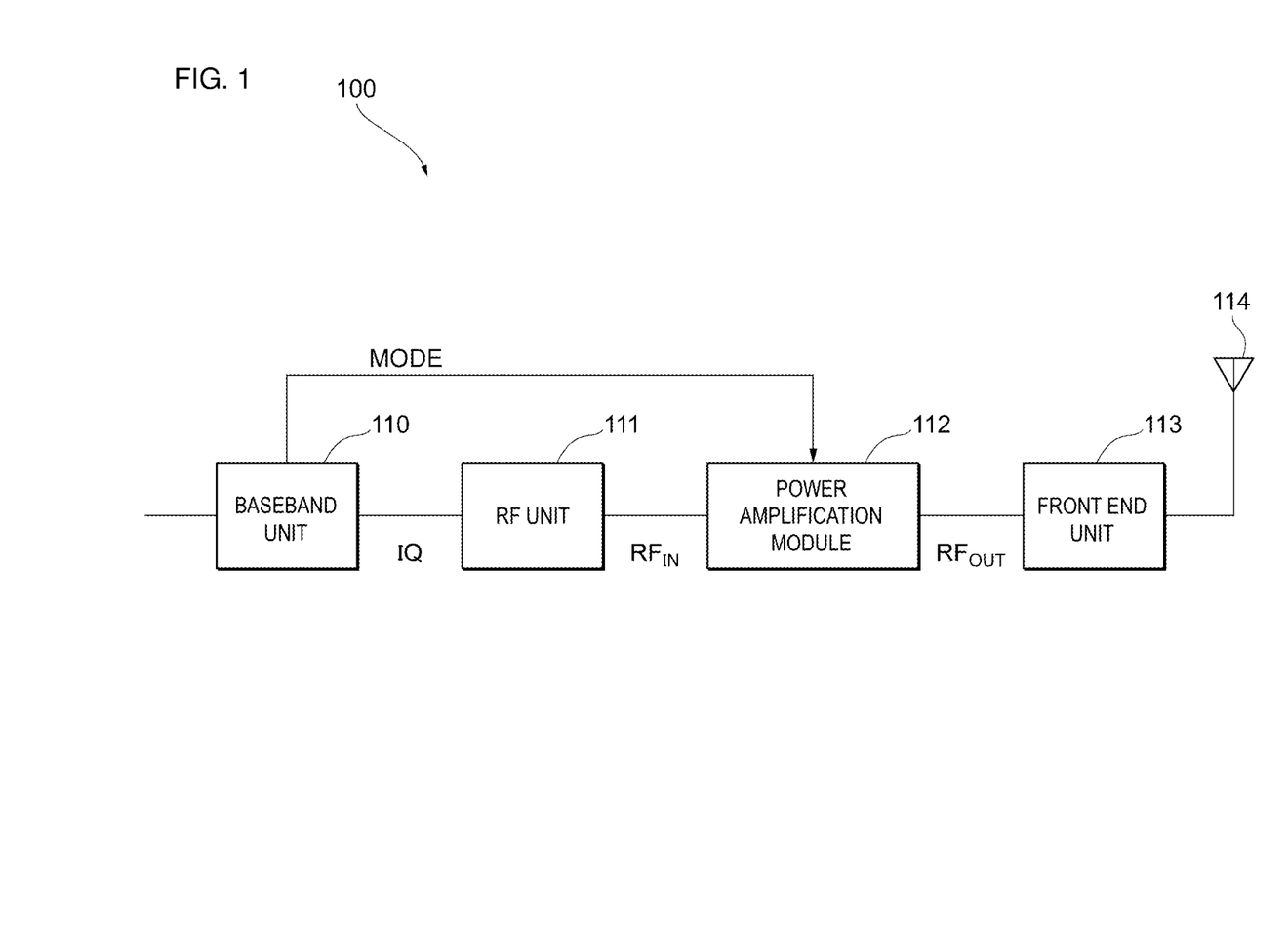
FIG. 1 illustrates an example configuration of a transmission unit that includes a power amplification module according to an embodiment of the present disclosure.

An embodiment of the present disclosure will be described while referring to the drawings. FIG. 1 illustrates an example configuration of a transmission unit 100 that includes a power amplification module according to an embodiment of the present disclosure. The transmission unit 100 is, for example, used in a mobile communication device such as a cellular phone in order to transmit various signals such as speech and data to a base station. Although such a mobile communication device would also be equipped with a reception unit for receiving signals from the base station, the description of such a reception unit is omitted here.

As illustrated in FIG. 1, the transmission unit 100 includes a base band unit 110, an RF unit 111, a power amplification module 112, a front end unit 113 and an antenna 114.

The base band unit 110 modulates an input signal such as speech or data on the basis of a modulation scheme such as high-speed uplink packet access (HSUPA) or long term evolution (LTE) and outputs a modulated signal. In this embodiment, the modulated signal output from the base band unit 110 is output as IQ signals (I signal and Q signal) in which the amplitude and the phase are represented on an IQ plane. The frequencies of the IQ signals are on the order of several MHz to several tens of MHz, for example. In addition, the base band unit 110 outputs a mode signal MODE that is for controlling the gain in the power amplification module 112.

The RF unit 111 generates an RF signal ($RF_{IN}$), which is for performing wireless transmission, from the IQ signals output from the base band unit 110. The RF signal has a frequency of around several hundred MHz to several GHz, for example.

The power amplification module 112 amplifies the power of the RF signal ($RF_{IN}$) output from the RF unit 111 up to the level that is required to transmit the RF signal to the base station, and outputs an amplified signal ($RF_{OUT}$). The size of a bias current in the power amplification module 112 is determined on the basis of the mode signal MODE supplied from the base band unit 110 and thereby the gain in the power amplification module 112 is controlled.

The front end unit 113 filters the amplified signal ($RF_{OUT}$) and switches a reception signal received from the base station. The amplified signal output from the front end unit 113 is transmitted to the base station via the antenna 114.

2. Configuration of Power Amplification Module

Figure 2:
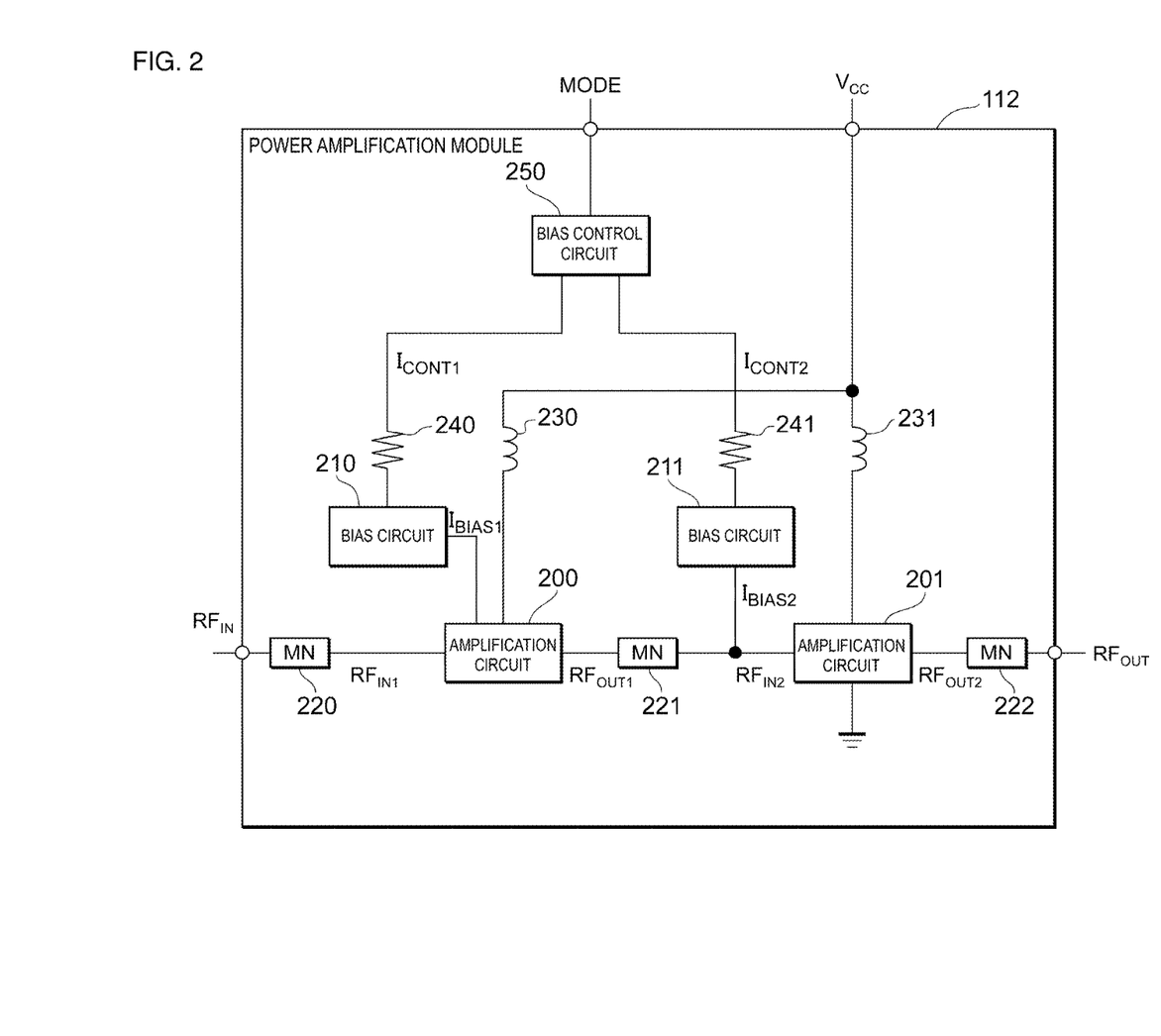
FIG. 2 illustrates an example configuration of the power amplification module.

FIG. 2 illustrates an example configuration of the power amplification module 112. As illustrated in FIG. 2, the power amplification module 112 includes amplification circuits 200 and 201, bias circuits 210 and 211, matching networks (MN) 220, 221 and 222, inductors 230 and 231, resistors 240 and 241 and a bias control circuit 250.

The amplification circuits 200 and 201 form a two-stage amplification circuit. The amplification circuit 200 amplifies an RF signal ($RF_{IN1}$) (example of first radio frequency signal) and outputs an amplified signal ($RF_{OUT1}$) (example of second radio frequency signal). The amplified signal ($RF_{OUT1}$) output from the amplification circuit 200 is input to the amplification circuit 201 via the matching network 221 as an RF signal ($RF_{IN2}$). The amplification circuit 201 amplifies the RF signal ($RF_{IN2}$) and outputs an amplified signal ($RF_{OUT2}$) (example of third radio frequency signal). In this embodiment, the number of stages of the amplification circuit of the power amplification module is two, but the number of stages of the amplification circuit is not limited to two and may be three or more. In the case where the amplification circuit has three or more stages, the same configuration as for the bias circuit 210, which will be described below, can be used for all the stages of the amplification circuit other than the final stage of the amplification circuit.

The bias circuits 210 and 211 respectively supply bias currents to the amplification circuits 200 and 201. The bias circuit 210 (example of first bias circuit) supplies a bias current $I_{BIAS1}$ (example of first bias current), which corresponds to a bias control current $I_{CONT1}$ output from the bias control circuit 250, to the amplification circuit 200. In addition, the bias circuit 211 (example of second bias circuit) supplies a bias current $I_{BIAS2}$ (example of second bias current), which corresponds to a bias control current $I_{CONT2}$ output from the bias control circuit 250, to the amplification circuit 201.

The matching networks 220, 221 and 222 are provided in order to match the impedances between the circuits. The matching networks 220, 221 and 222 are formed using inductors and capacitors, for example.

The inductors 230 and 231 are provided in order to isolate the RF signal. A power supply voltage $V_{CC}$ is supplied to the amplification circuits 200 and 201 via the inductors 230 and 231, respectively.

The bias control circuit 250 outputs the bias control currents $I_{CONT1}$ and $I_{CONT2}$, which are for controlling the bias currents $I_{BIAS1}$ and $I_{BIAS2}$, on the basis of the mode signal MODE. The bias control current $I_{CONT1}$ is supplied to the bias circuit 210 via the resistor 240. In addition, the bias control current $I_{CONT2}$ is supplied to the bias circuit 211 via the resistor 241. By providing the power amplification module 112 with the resistors 240 and 241, changes in the impedances of the bias circuits 210 and 211 seen from the bias control circuit 250 can be suppressed. In the power amplification module 112, the gain is controlled by controlling the bias currents $I_{BIAS1}$ and $I_{BIAS2}$. The bias control circuit 250 may be provided outside of the power amplification module 112. In addition, the power amplification module 112 does not need to include the resistors 240 and 241.

3. Configurations of Amplification Circuit and Bias Circuit of First Stage

Figure 3:
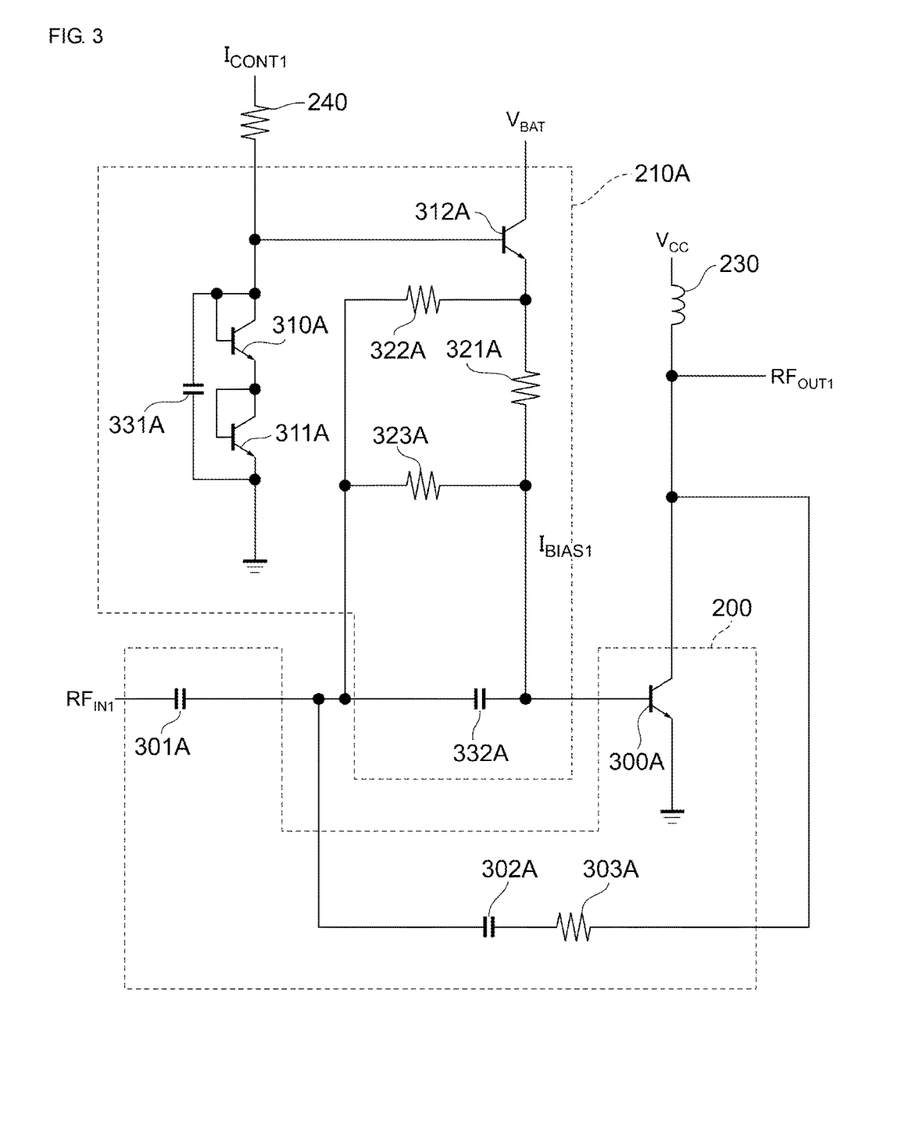
FIG. 3 illustrates example configurations of an amplification circuit and a bias circuit.

FIG. 3 illustrates example configurations of the amplification circuit 200 and the bias circuit 210.

The amplification circuit 200 includes a transistor 300A (example of first transistor), a capacitor 301A, a capacitor 302A and a resistor 303A.

The transistor 300A is a heterojunction bipolar transistor (HBT), for example. The RF signal ($RF_{IN1}$) is input to the base of the transistor 300A via the capacitor 301A and a capacitor 332A, which will be described later. The power supply voltage $V_{CC}$ is supplied to the collector of the transistor 300A via the inductor 230. The transistor 300A has a common emitter. In addition, the bias current $I_{BIAS1}$ is supplied to the base of the transistor 300A. The amplified signal ($RF_{OUT1}$) is output from the collector of the transistor 300A.

The capacitor 301A outputs the RF signal ($RF_{IN1}$) after removing a direct-current component therefrom and ensures that a direct current component of a bias circuit 210A does not return to the RF unit 111. The RF signal output from the capacitor 301A is input to the base of the transistor 300A via the capacitor 332A.

The capacitor 302A and the resistor 303A form a feedback circuit. One end of the capacitor 302A is connected to a connection point between the capacitors 301A and 332A and the other end of the capacitor 302A is connected to one end of the resistor 303A. The other end of the resistor 303A is connected to the collector of the transistor 300A. This feedback circuit is provided in order to adjust the gain and match the input in the amplification circuit 200.

Next, the configuration of the bias circuit 210A (example of the bias circuit 210) will be described. The bias circuit 210A includes transistors 310A, 311A and 312A, capacitors 331A and 332A and resistors 321A, 322A and 323A. The transistors 310A to 312A are HBTs, for example. By using HBTs for all of the transistors used in the bias circuit 210A and the amplification circuit 200, it becomes easy to form the bias circuit 210A and the amplification circuit 200 on a single chip.

The transistor 310A has a so-called diode-connected configuration in which the collector and the base are connected to each other. The bias control current $I_{CONT1}$ is supplied to the collector of the (hereafter, diode-connected) transistor 310A. The transistor 311A is diode connected, the collector thereof is connected to the emitter of the transistor 310A, and the emitter of the transistor 311A is connected to ground. A power supply voltage (for example, battery voltage $V_{BAT}$) is supplied to the collector of the transistor 312A (example of third transistor) and the base of the transistor 312A is connected to the collector of the transistor 310A. One end of the capacitor 331A is connected to the collector of the transistor 310A and the other end of the capacitor 331A is connected to the emitter of the transistor 311A.

The RF signal ($RF_{IN1}$) is input to one end of the capacitor 332A via the capacitor 301A and the other end of the capacitor 332A is connected to the base of the transistor 300A. One end of the resistor 321A (example of first resistor) is connected to the emitter of the transistor 312A and the other end of the resistor 321A is connected to the base of the transistor 300A. One end of the resistor 322A (example of second resistor) is connected to the one end of the capacitor 332A and the other end of the resistor 322A is connected to the emitter of the transistor 312A. One end of the resistor 323A (example of third resistor) is connected to the one end of the capacitor 332A and the other end of the resistor 323A is connected to the base of the transistor 300A.

Next, the function of the bias circuit 210A will be described. In the bias circuit 210A, the bias current $I_{BIAS1}$, which corresponds to the bias control current $I_{CONT1}$, is output from the emitter of the transistor 312A. Here, the size of the bias current $I_{BIAS1}$ output from the emitter of the transistor 312A varies due to the effect of the RF signal ($RF_{IN1}$). When the level of the RF signal ($RF_{IN1}$) becomes large (also referred to as "at time of large signal"), the output bias current $I_{BIAS1}$ also becomes large. This point will be described in detail below.

There are two paths along which the bias current $I_{BIAS1}$ flows, namely, a path that extends from the emitter of the transistor 312A and passes through the resistor 321A (path 1) and a path that extends from the emitter of the transistor 312A and passes through the resistors 322A and 323A (path 2). Normally, two paths are not provided and a single resistor having the combined resistance value of the resistors 321A, 322A and 323A is provided between the emitter of the transistor 312A and the base of the transistor 300A. As a result of two paths being provided in the bias circuit 210A, the effect of the RF signal ($RF_{IN1}$) output from the capacitor 301A is transmitted to the emitter of the transistor 312A via the resistor 322A. Therefore, compared to the case where a single large resistor is provided, the effect that the RF signal ($RF_{IN1}$) exerts on the emitter of the transistor 312A can be increased. Consequently, at the time of a large signal, the bias current $I_{BIAS1}$ output from the transistor 312A can be increased, and as a result, the output power of the amplification circuit 200 can be increased.

In addition, the effect that the RF signal ($RF_{IN1}$) exerts on the emitter of the transistor 312A can be made even larger by setting the resistance value of the resistor 322A so as to be smaller than the resistance value of the resistor 321A. As a result, at the time of a large signal, an even larger bias current $I_{BIAS1}$ can be output from the transistor 312A. The size of the bias current $I_{BIAS1}$ can be adjusted by adjusting the resistance values of the resistors 321A, 322A and 323A in the bias circuit 210A.

Furthermore, as a result of the capacitor 332A being connected in parallel with the resistor 323A in the bias circuit 210A, a direct current component of the RF signal ($RF_{IN1}$) is input to the base of the transistor 300A via the capacitor 332A without necessarily passing through the resistor 323A. Therefore, it is possible to prevent the RF signal ($RF_{IN1}$) input to the base of the transistor 300A from being attenuated.

In addition, the parallel-connected capacitor 332A and the resistor 323A (RC parallel circuit) form an oscillation stabilization circuit. The capacitor 332A of the RC parallel circuit is in a disconnected state for a low-frequency signal and the capacitor 332A of the RC parallel circuit is in a short-circuited state for a high-frequency signal. Consequently, a low-frequency signal passes through the resistor 323A and a high-frequency signal passes through the capacitor 332A. In other words, the RC parallel circuit is in a resistive state for a low-frequency signal and is in a short-circuited state for a high-frequency signal. Therefore, the RC parallel circuit is in a resistive state for signals having a lower frequency than the use frequency and can suppress the oscillation of a low-frequency signal and improve stability. On the other hand, the RC parallel circuit is in a short-circuited state for signals having a higher frequency than the use frequency and can input a high-frequency signal to the base of the transistor 300A without necessarily a loss. In addition, in the RC parallel circuit, a low-frequency signal passes through the resistor 323A and a high-frequency signal passes through the capacitor 332A. Therefore, for example, oscillation stability can be adjusted with the resistance value of the resistor 323A and the frequency of a signal at which the RC parallel circuit is to enter a short-circuited state can be adjusted with the capacitance of the capacitor 332A.

The transistors 310A and 312A may be enhancement-type field-effect transistors (FETs). In that case, the bias current $I_{BIAS1}$ would be output from the source of the FET. The threshold voltage at which a HBT turns on is around 1.3 V, for example. Therefore, in the case where the transistors 310A and 312A are HBTs, the voltage of the input terminal of the bias control current $I_{CONT1}$ would need to be around 2.8 V. On the other hand, the threshold voltage at which an enhancement-type FET turns on is lower than the threshold voltage at which a HBT turns on and is around 0.5 V, for example. Therefore, in the case where the transistors 310A and 312A are enhancement-type FETs, the voltage of the input terminal of the bias control current $I_{CONT1}$ may be around 2.0 V, which is lower than in the case of a HBT (around 2.8 V).

4. Configurations of Amplification Circuit and Bias Circuit of Second Stage

Figure 4:
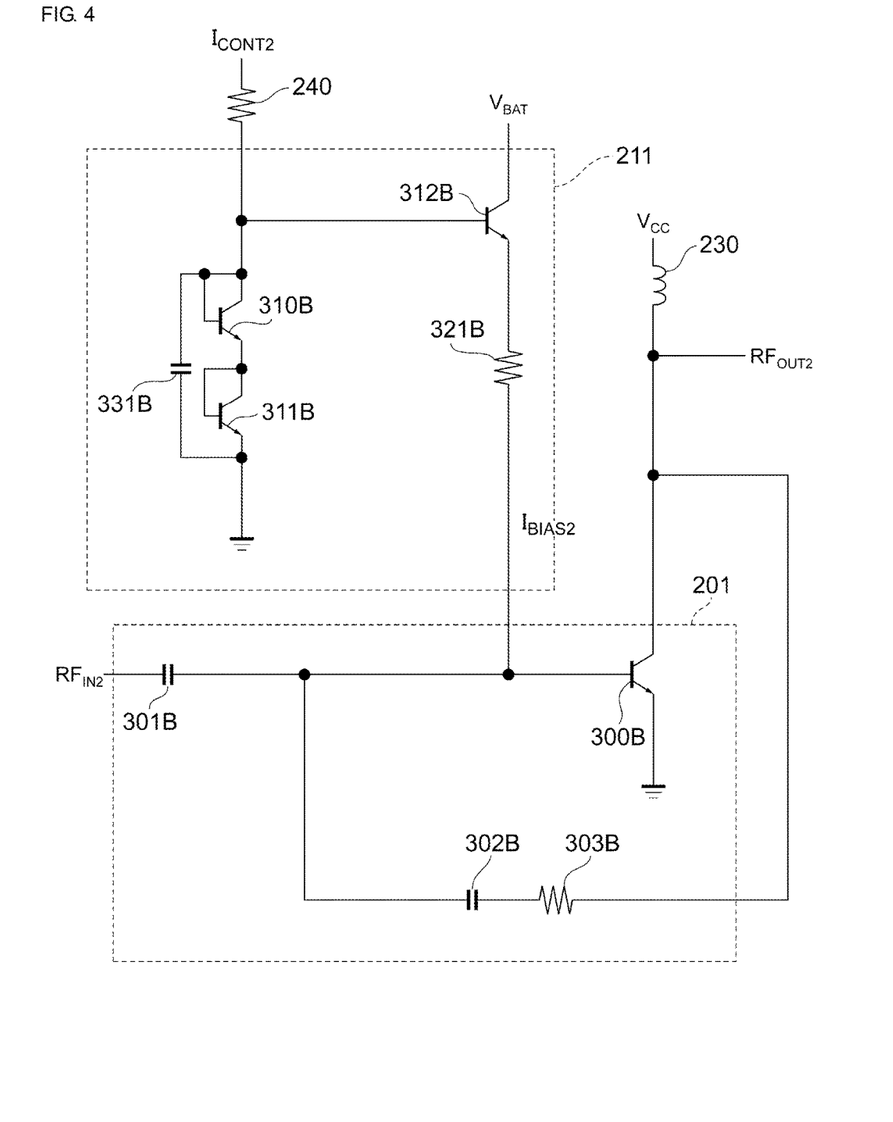
FIG. 4 illustrates example configurations of an amplification circuit and a bias circuit.

FIG. 4 illustrates example configurations of the amplification circuit 201 and the bias circuit 211. Constituent elements that are the same as those of the amplification circuit 200 and the bias circuit 210A illustrated in FIG. 3 are denoted by the same symbols and detailed description thereof is omitted.

The amplification circuit 201 includes a transistor 300B (example of second transistor), a capacitor 301B, a capacitor 302B and a resistor 303B. The configuration of the inside of the amplification circuit 201 is similar to that of the inside of the amplification circuit 200 and therefore detailed description thereof is omitted. The size (emitter area) of the transistor 300B is around ten times that of the transistor 300A, for example.

The bias circuit 211 includes transistors 310B, 311B and 312B, a capacitor 331B and a resistor 321B. The transistor 310B is diode-connected and the bias control current $I_{CONT2}$ is supplied to the collector thereof. The transistor 311B is diode-connected, the collector thereof is connected to the emitter of the transistor 310B, and the emitter of the transistor 311B is connected to ground. A power supply voltage (for example, battery voltage VBAT) is supplied to the collector of the transistor 312B (example of third transistor) and the base of the transistor 312B is connected to the collector of the transistor 310B. One end of the capacitor 331B is connected to the collector of the transistor 310B and the other end of the capacitor 331B is connected to the emitter of the transistor 311B. One end of the resistor 321B is connected to the emitter of the transistor 312B and the other end of the resistor 321B is connected to the base of the transistor 300B.

In the bias circuit 211, the bias current $I_{BIAS2}$ output from the emitter of the transistor 312B is input to the base of the transistor 300B via the resistor 321B. The resistance value of the resistor 321B can be of a sufficient size in order to suppress consumption of current in the amplification circuit 201. For example, when E1 represents the emitter area of the transistor 300A of the amplification circuit 200 of the first stage, R1 represents the combined resistance value of the resistors 321A to 323A of the bias circuit 210A of the first stage, E2 represents the emitter area of the transistor 300B of the amplification circuit 201 of the second stage, and R2 represents the resistance value of the resistor 321B of the bias circuit 211 of the second stage, the relation R1×E1<R2×E2 can be set. Consequently, an increase in the consumption of current in the amplification circuit 201 of the second stage can be suppressed and the efficiency of the entire power amplification module 112 can be improved.

5. Linearity of Power Amplification Module

Figure 5A:
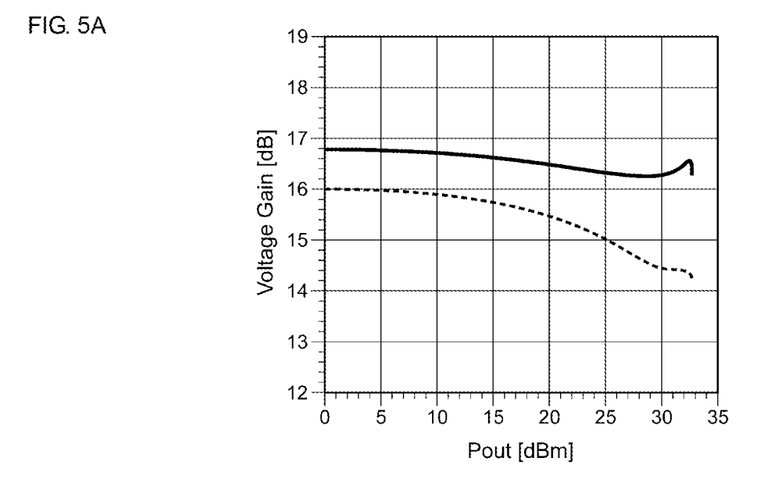
FIG. 5A illustrates an example of the linearity of the power amplification module according to the embodiment.
Figure 5B:
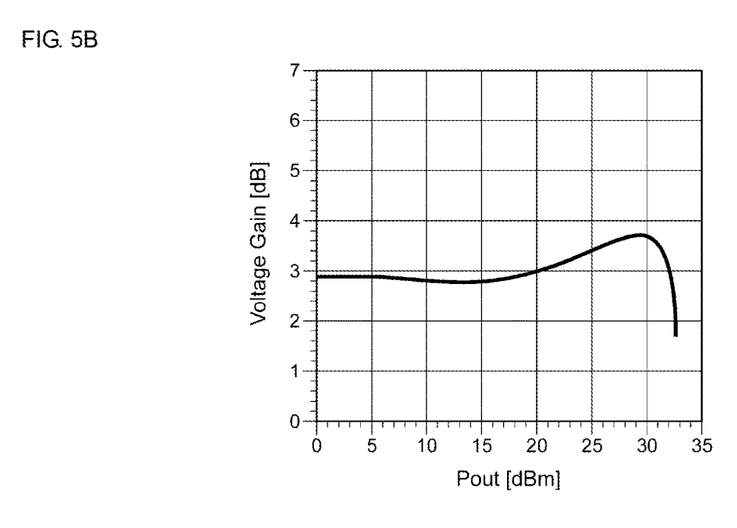
FIG. 5B illustrates an example of the linearity of the power amplification module according to the embodiment.
Figure 5C:
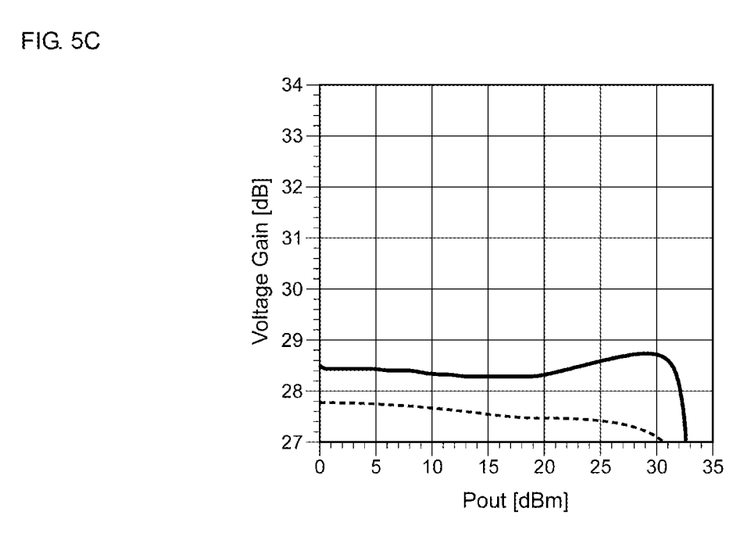
FIG. 5C illustrates an example of the linearity of the power amplification module according to the embodiment.

FIGS. 5A to 5C illustrate simulation results of the voltage gain characteristics of the power amplification module 112 according to this embodiment. In the graphs illustrated in FIGS. 5A to 5C, the horizontal axis represents output power [dBm] and the vertical axis represents voltage gain [dB]. In each of the figures, a solid line represents simulation results obtained in the case where the power amplification module 112 includes the bias circuit 210A according to this embodiment. On the other hand, the dotted lines in FIGS. 5A and 5C represent simulation results for a power amplification module of a comparative example. The comparative example has the same configuration as the power amplification module 112 except that the bias circuit 210A does not include the resistor 322A.

FIG. 5A is a graph illustrating the gain characteristics of the amplification circuit 200 (driver stage) of this embodiment and the gain characteristics of the amplification circuit of the comparative example. For the comparative example, characteristics are illustrated in which the voltage gain decreases toward the bottom right (gain compression) as the output power increases. In contrast, as a result of the resistor 322A being provided between the emitter of the transistor 312A and the connection point between the capacitors 301A and 332A in the bias circuit 210 connected to the amplification circuit 200, the effect that the RF signal (RF$_{IN1}$) exerts on the emitter of the transistor 312A can be increased. Specifically, when the RF signal (RF$_{IN1}$) acts on the transistor 312A, there is an effect in which the base-emitter potential of the transistor 312A rises and falls. As a result, since there is a diode structure between the base and the emitter, the characteristics of the diode change exponentially and therefore the average DC current increases. Consequently, there is an effect that the bias current is increased and the gain is caused to rise. Therefore, since the bias current I$_{BIAS1}$ input to the base of the transistor 300A increases at the time of a large signal, the amplification circuit 200 can reduce a decrease in the voltage gain that occurs with an increase in the output voltage compared with the case of the comparative example.

FIG. 5B is a graph illustrating the gain characteristics of the amplification circuit 201 (output stage). An RF signal (RF$_{IN2}$) input to the amplification circuit 201 has a comparatively high level. Consequently, in the amplification circuit 201, the gain increases (gain expansion) due to the effect that the RF signal (RF$_{IN2}$) exerts on the emitter of the transistor 312B in the region where the output power is large. Since there is no difference in the structure of the amplification circuit 201 between the power amplification module 112 and the comparative example, the same simulation results are obtained in both cases.

FIG. 5C is a graph illustrating the gain characteristics for the entire power amplification module 112 and the entire comparative example. As illustrated in FIG. 5C, the voltage gain gradually decreases as the output power increases in the case of the comparative example. In contrast, in the case of the power amplification module 112 according to this embodiment, the decrease in the voltage gain that occurs with an increase in the output voltage is suppressed in FIG. 5A and this decrease is combined with the gain expansion characteristics in the graph of FIG. 5B and as a result the linearity of the entire power amplification module 112 is improved compared with the comparative example, as illustrated in FIG. 5C. The term "linearity" used here refers to the gain being constant with changes in the output level.

Furthermore, since the consumption of current is suppressed in the amplification circuit 201, efficient power amplification can be performed across the entire power amplification module 112.

6. Other Configurations of Bias Circuit of First Stage

Figure 6:
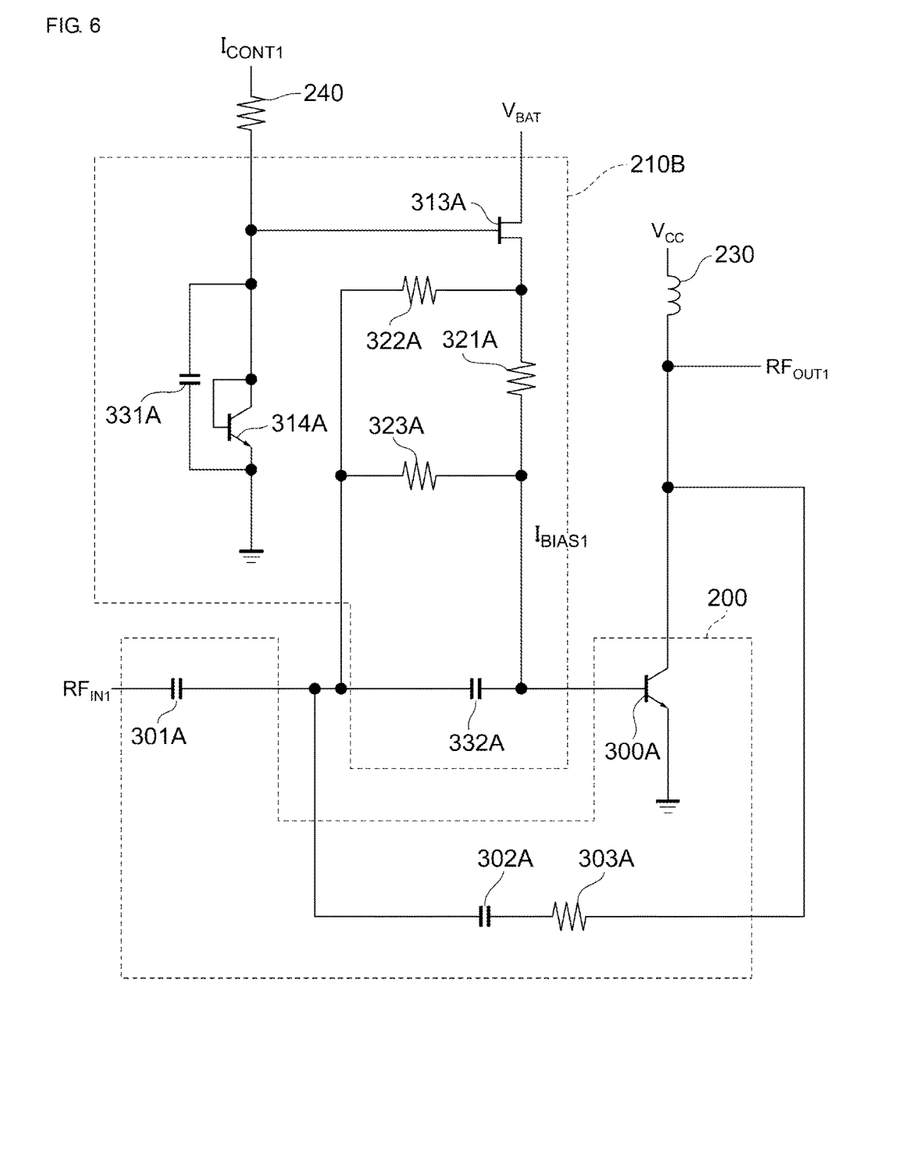
FIG. 6 illustrates another example configuration of a bias circuit.

FIG. 6 illustrates another example configuration of the bias circuit 210. Constituent elements that are the same as those of the bias circuit 210A illustrated in FIG. 3 are denoted by the same symbols and description thereof is omitted.

A bias circuit 210B includes a transistor 313A instead of the transistor 312A of the bias circuit 210A. In addition, the bias circuit 210B includes a transistor 314A instead of the transistors 310A and 311A of the bias circuit 210A.

The transistor 314A is a HBT, for example. The transistor 314A is diode connected, has the bias control current I$_{CONT1}$ supplied to the collector thereof and the emitter is connected to ground.

The transistor 313A is a depletion-type FET. A power supply voltage (for example, battery voltage VBAT) is supplied to the drain of the transistor 313A and the gate of the transistor 313A is connected to the collector of the transistor 314A. In addition, the bias current I$_{BIAS1}$ is output from the source of the transistor 313A. A depletion-type FET is a transistor that turns on at a negative threshold voltage (for example, around −1.0 V). Therefore, in the bias circuit 210B, the voltage of the input terminal of the bias control current I$_{CONT1}$ may be around 1.3 V, which is lower than in the case of the bias circuit 210A (around 2.8 V).

Figure 7:
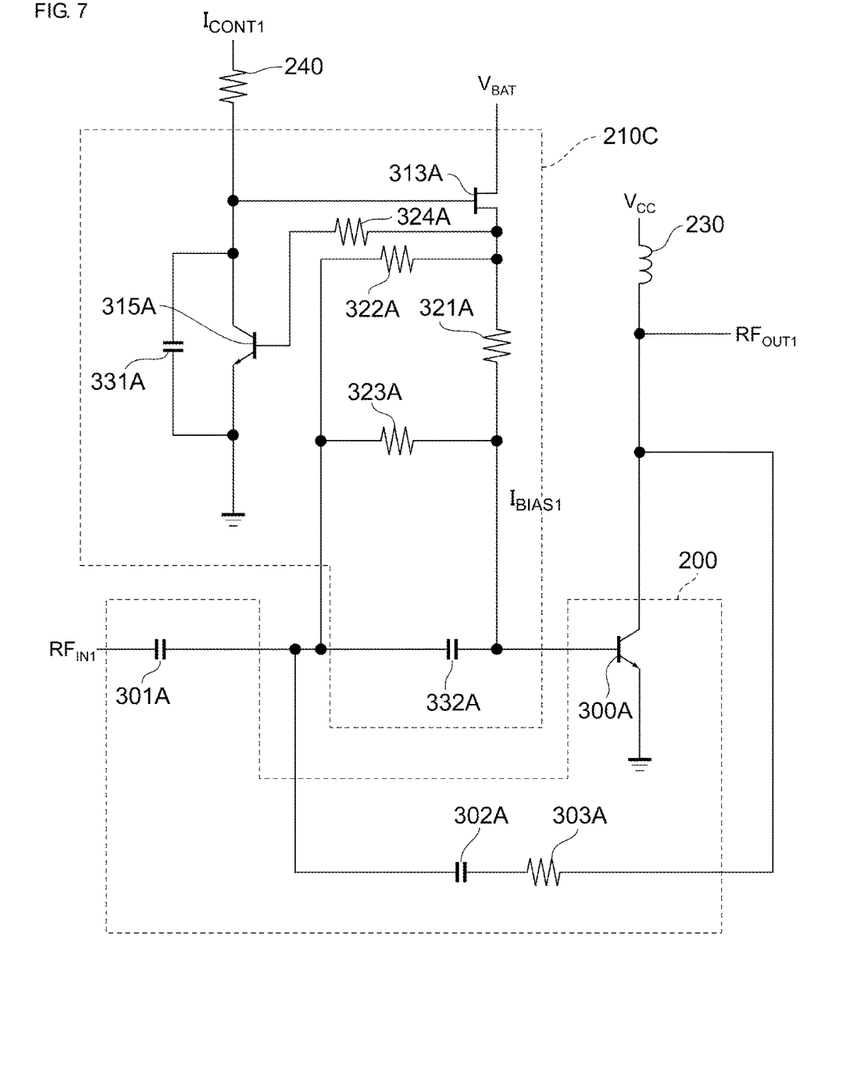
FIG. 7 illustrates another example configuration of a bias circuit.

FIG. 7 illustrates another example configuration of the bias circuit 210. Constituent elements that are the same as those of the bias circuit 210B illustrated in FIG. 6 are denoted by the same symbols and description thereof is omitted.

A bias circuit 210C includes a resistor 324A in addition to the constituent components of the bias circuit 210B. In addition, the bias circuit 210C includes a transistor 315A instead of the transistor 314A of the bias circuit 210B.

The transistor 315A is a HBT, for example. The bias control current I$_{CONT1}$ is supplied to the collector of the transistor 315A, the transistor 315A has a common emitter and the base thereof is connected to one end of the resistor 324A. The other end of the resistor 324A is connected to the source of the transistor 313A.

As described above, the threshold voltage of a HBT is around 1.3 V and the threshold voltage of a depletion-type FET is around −1.0 V, for example. Therefore, in the bias circuit 210C, the voltage of the input terminal of the bias control current I$_{CONT1}$ may be around 0.3 V, which is lower than in the case of the bias circuit 210A (around 2.8 V). The other effects of the bias circuit 210C are the same as those of the bias circuit 210A.

Figure 8:
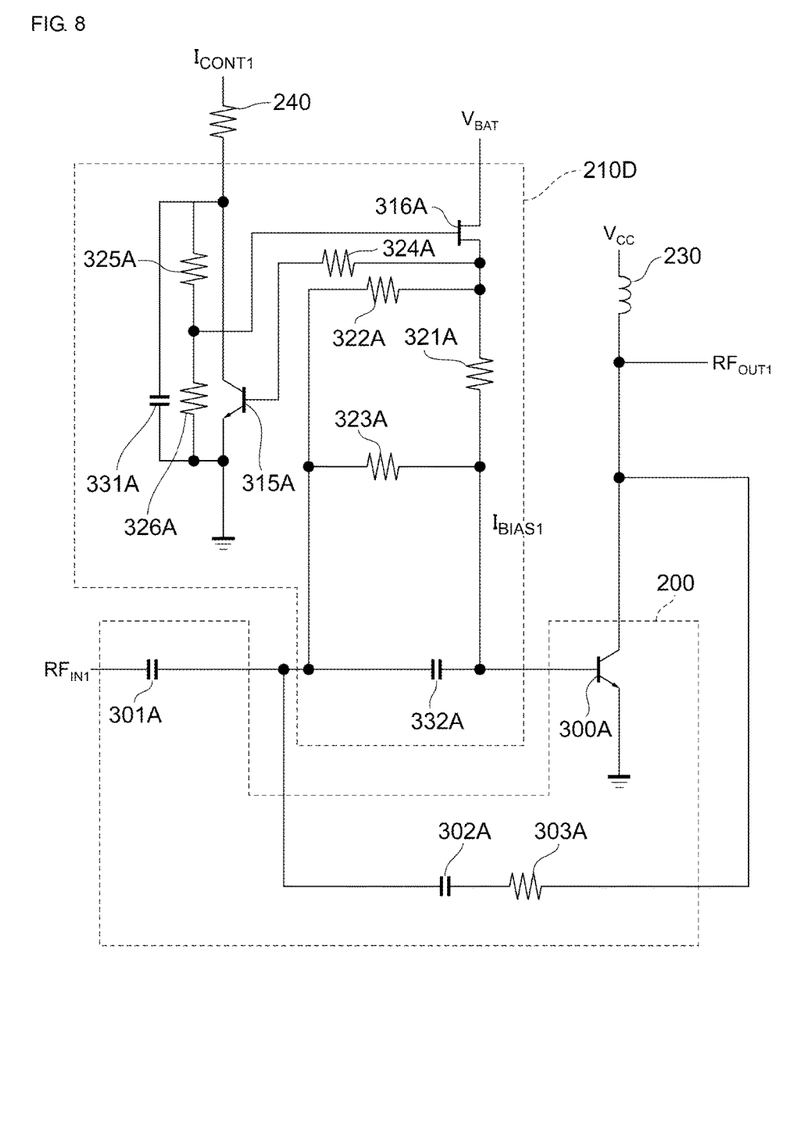
FIG. 8 illustrates another example configuration of a bias circuit.

FIG. 8 illustrates another example configuration of the bias circuit 210. Constituent elements that are the same as those of the bias circuit 210C illustrated in FIG. 7 are denoted by the same symbols and description thereof is omitted.

A bias circuit 210D includes resistors 325A and 326A in addition to the constituent components of the bias circuit 210C. Furthermore, the bias circuit 210D includes a transistor 316A instead of the transistor 313A of the bias circuit 210C.

The transistor 316A is a depletion-type FET. A power supply voltage (for example, battery voltage VBAT) is supplied to the drain of the transistor 316A and the gate of the transistor 316A is connected between the resistor 325A and the resistor 326A. In addition, the bias current $I_{BIAS1}$ is output from the source of the transistor 316A. One end of the resistor 325A is connected to the collector of the transistor 315A. One end of the resistor 326A is connected to the other end of the resistor 325A and the other end of the resistor 326A is connected to the emitter of the transistor 315A.

In the bias circuit 210D illustrated in FIG. 8, a resistance voltage divider circuit (resistors 325A and 326A) is connected between the collector and the emitter of the bias-use transistor 315A.

When a depletion-type FET having a low threshold voltage (for example, −1.0 V or less) is used as the transistor 313A in the bias circuit 210C illustrated in FIG. 7, it is possible that the transistor 315A will not operate due to a fall in the collector-emitter voltage of the transistor 315A.

In contrast, since a fall in the collector voltage of the transistor 315A is suppressed by the resistance voltage divider circuit in the bias circuit 210D illustrated in FIG. 8, a depletion-type FET having a low threshold voltage (for example, −1.0 V or less) can be used.

Exemplary embodiments of the present disclosure have been described above. In the power amplification module 112 according to this embodiment, as a result of the resistor 322A being provided between the emitter of the transistor 312A and the connection point between the capacitors 301A and 332A in the bias circuit 210A connected to the amplification circuit 200, the effect that the RF signal ($RF_{IN1}$) exerts on the emitter of the transistor 312A can be increased. Therefore, since the bias current $I_{BIAS1}$ input to the base of the transistor 300A increases at the time of a large signal, the amplification circuit 200 can reduce a decrease in the voltage gain that occurs with an increase in the output voltage. Since the amplification circuit 201 has gain expansion characteristics, the linearity of the entire power amplification module 112 is improved.

In addition, in the power amplification module 112, a HBT can be used as the transistor that outputs the bias current $I_{BIAS1}$ (transistor 312A) in the bias circuit 210. As a result, since HBTs are employed for the transistors used in the bias circuit 210A and the amplification circuit 200, it is easy to form the bias circuit 210A and the amplification circuit 200 on a single chip.

Furthermore, in the power amplification module 112, an FET can be used as the transistor that outputs the bias current $I_{BIAS1}$ (transistor 312A, transistor 313A or transistor 316A) in the bias circuit 210. Thus, the voltage of the input terminal of the bias control current $I_{CONT1}$ can be reduced compared to a case where a HBT is used as the transistor that outputs the bias current $I_{BIAS1}$.

Furthermore, the effect that the RF signal ($RF_{IN1}$) exerts on the emitter or the source of the transistor that outputs the bias current $I_{BIAS1}$ (transistor 312A, transistor 313A or transistor 316A) can be increased by setting the resistance value of the resistor 322A of the bias circuit 210 to be smaller than the resistance value of the resistor 321A. As a result, at the time of a large signal, a larger bias current $I_{BIAS1}$ can be output.

The purpose of the embodiments described above is to enable easy understanding of the present disclosure and the embodiments are not to be interpreted as limiting the present disclosure. The present disclosure can be modified or improved without departing from the gist of the disclosure and equivalents to the present disclosure are also included in the present disclosure. In other words, appropriate design changes made to the embodiments by a person skilled in the art are included in the scope of the present disclosure so long as the changes have the characteristics of the present disclosure. For example, the elements included in the embodiments and the arrangements, materials, conditions, shapes, sizes and so forth of the elements are not limited to those exemplified in the embodiments and can be appropriately changed. In addition, the elements included in the embodiments can be combined as much as technically possible and such combined elements are also included in the scope of the present disclosure so long as the combined elements have the characteristics of the present disclosure.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplification module comprising:
   a first transistor that amplifies a first radio frequency signal and outputs a second radio frequency signal;
   a second transistor that amplifies the second radio frequency signal and outputs a third radio frequency signal;
   a first bias circuit that supplies a first bias current to a base of the first transistor; and
   a second bias circuit that supplies a second bias current to a base of the second transistor;
   wherein the first bias circuit includes:
      a third transistor, wherein the first bias current is output from a source of the third transistor,
      a capacitor, wherein the first radio frequency signal is input to a first end of the capacitor and a second end of the capacitor is connected to the base of the first transistor,
      a first resistor, wherein a first end of the first resistor is connected to the source of the third transistor and a second end of the first resistor is connected to the base of the first transistor,
      a second resistor, wherein a first end of the second resistor is connected to the first end of the capacitor and a second end of the second resistor is connected to the source of the third transistor, and
      a third resistor, wherein a first end of the third resistor is connected to the first end of the capacitor and a second end of the third resistor is connected to the base of the first transistor and,
      wherein a resistance value of the second resistor is smaller than a resistance value of the first resistor.

2. The power amplification module according to claim 1, wherein the first bias circuit further includes:
   a fourth transistor and a fifth transistor, an emitter of the fourth transistor being connected to a collector of the fifth transistor, wherein a base of the fourth transistor is connected to a collector of the fourth transistor and to a gate of the third transistor, a base of the fifth transistor is connected to the collector of the fifth transistor, and the emitter of the fifth transistor is grounded; and
   a second capacitor connected between the collector of the fourth transistor and the emitter of the fifth transistor.

3. The power amplification module according to claim 1, wherein the first bias circuit further includes:
   a fourth transistor, wherein a collector of the fourth transistor is connected to a gate of the third transistor, an emitter of the fourth transistor is grounded, and a base of the fourth transistor is connected to the collector of the fourth transistor; and a second capacitor connected between the collector of the fourth transistor and the emitter of the fourth transistor.

4. The power amplification module according to claim 1, wherein the first bias circuit further includes:

a fourth transistor, wherein a collector of the fourth transistor is connected to a gate of the third transistor, an emitter of the fourth transistor is grounded, and a base of the fourth transistor is connected to the source of the third transistor; and a second capacitor connected between the collector of the fourth transistor and the emitter of the fourth transistor.

5. The power amplification module according to claim 1, wherein the first bias circuit further includes:

a voltage divider;

a fourth transistor, wherein a collector of the fourth transistor is connected to a first end of the voltage divider, an emitter of the fourth transistor is grounded and connected to a second end of the voltage divider, and a base of the fourth transistor is connected to the source of the third transistor; and a second capacitor connected between the collector of the fourth transistor and the emitter of the fourth transistor, wherein a gate of the third transistor is connected to the voltage divider between the first end and second end of the voltage divider.

* * * * *